(12) United States Patent
Denoyer

(10) Patent No.: US 7,418,213 B2
(45) Date of Patent: Aug. 26, 2008

(54) TRANSIMPEDANCE AMPLIFIER WITH INTEGRATED FILTERING AND REDUCED PARASITIC CAPACITANCE

(75) Inventor: Gilles P. Denoyer, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 467 days.

(21) Appl. No.: 10/917,136

(22) Filed: Aug. 12, 2004

(65) Prior Publication Data

US 2006/0034621 A1   Feb. 16, 2006

(51) Int. Cl.
| | |
|---|---|
| H04B 10/00 | (2006.01) |
| H03F 3/45 | (2006.01) |
| H03F 1/34 | (2006.01) |
| H03F 3/08 | (2006.01) |
| H01S 3/10 | (2006.01) |
| G02B 6/42 | (2006.01) |
| H03H 1/02 | (2006.01) |

(52) U.S. Cl. .................. 398/210; 398/116; 398/117; 398/156; 398/164; 250/214 C; 250/227.12; 330/308; 330/59; 330/252

(58) Field of Classification Search ............. 398/116, 398/117, 156, 164, 210; 250/214 C, 227.12; 330/308, 59, 252

See application file for complete search history.

(56) References Cited

U.S. PATENT DOCUMENTS

| | | | |
|---|---|---|---|
| 4,132,958 A * | 1/1979 | Addis et al. ............... 330/252 |
| 4,574,249 A | 3/1986 | Williams .................. 330/59 |
| 5,012,202 A | 4/1991 | Taylor | |
| 5,304,793 A | 4/1994 | Grasset .................. 250/214 |
| 5,459,311 A * | 10/1995 | Brosnan ............... 250/214 C |
| 5,606,277 A | 2/1997 | Feliz ..................... 327/311 |
| 5,646,573 A * | 7/1997 | Bayruns et al. ............ 330/59 |
| 5,815,051 A * | 9/1998 | Hamasaki et al. .......... 333/172 |
| 6,069,534 A | 5/2000 | Kobayashi .............. 330/308 |
| 6,141,169 A | 10/2000 | Pietruszynski et al. ....... 360/67 |
| 6,239,659 B1 | 5/2001 | Grassle | |
| 6,297,701 B1 | 10/2001 | Viocchi et al. | |
| 6,359,517 B1 | 3/2002 | Colaco ................. 330/308 |
| 6,404,281 B1 | 6/2002 | Kobayashi | |
| 6,704,515 B1 * | 3/2004 | Chan et al. ............. 398/116 |
| 6,771,132 B1 | 8/2004 | Denoyer et al. .......... 330/308 |
| 6,778,021 B2 | 8/2004 | Denoyer et al. .......... 330/308 |
| 2003/0142929 A1 * | 7/2003 | Bartur et al. ............ 385/92 |
| 2004/0124927 A1 * | 7/2004 | Jung et al. ............. 330/308 |

OTHER PUBLICATIONS

David A. Johns, Analog Integrated Circuit Design, 1997, John Wiley & Sons, pp. 106-121.*

Design on Integrated Circuits for Optical Communications, Behzad Razavi, McGraw Hill, pp. 62-122; published 2003; ISBN 0-07-282258-9.

* cited by examiner

*Primary Examiner*—Jason Chan
*Assistant Examiner*—Danny W Leung
(74) *Attorney, Agent, or Firm*—Workman Nydegger

(57) ABSTRACT

A transimpedance amplifier (TIA) with integrated filtering. A capacitance is integrated into the TIA and connected to the power supply and to an internal ground of the TIA. Noise on the power supply of the transimpedance amplifier is filtered by the capacitor such that the power supply noise is reduced. The integrated capacitor also reduces noise ground. The integrated capacitor also reduces the effects of common mode noise that may be received from another circuit.

28 Claims, 6 Drawing Sheets

TRANSIMPEDANCE AMPLIFIER WITH INTEGRATED FILTERING AND REDUCED PARASITIC CAPACITANCE

RELATED APPLICATIONS

Not applicable.

BACKGROUND OF THE INVENTION

1. The Field of the Invention

The present invention generally relates to optoelectronic components, such as optical receivers. More particularly, embodiments of the invention relate to systems and methods for filtering high frequency noise from a transimpedance amplifier including power supply noise, ground noise, and output common mode noise.

2. Related Technology

Fiber optic cables are one of the mediums used in computer and telecommunication networks. Fiber optic networks use modulated light signals to transmit data. The light is often generated by a laser whose current is modulated to represent the ones and zeroes of the digital data stream. Although light signals are used to carry data over fiber optic cables, the light signals are typically converted into electrical signals in order to extract and process the data. Computers need some type of device to detect and translate the optical signals.

Optical receivers are specifically built for the purpose of receiving and interpreting light signals. An optical receiver typically includes some sort of detector that can generate an electrical current or voltage in response to changes in the power of the incident optical signal. After the fiber optic receiver converts the optical signal received over the optical fiber into an electrical signal, the optical receiver amplifies the electrical signal, and converts the electrical signal into an electrical digital data stream.

One of the common devices used as a detector in an optical receiver is a photodiode. A photodiode operates by generating a current in response to incident light. The optical power of the incident light determines the current that flows in the photodiode. In effect, the optical signal generates current in the photodiode that corresponds to the digital data carried by the optical fiber.

In order to operate properly, the photodiode is reverse biased having its anode connected to the input of the transimpedance amplifier and its cathode to a power supply or a biasing circuit. Ideally, the power supply or biasing circuit provides a constant voltage such that the current in the photodiode is attributable to the incident optical signal. Unfortunately, power supplies almost invariably have noise. The noise may come from switching, host board connections, and other sources. Further, power supply noise often is at a frequency that may be in the same range as the frequency of the data being transmitted on the optical network. As a result, the noise of the power supply can influence the current that is generated by the photodiode and has a detrimental effect on the performance of the optical receiver.

The noise on the power supply enters the transimpedance amplifier with the current generated by the incident light signal. The noise is amplified by the transimpedance amplifier along with the signal from the photodiode. Thus, the performance of the transimpedance amplifier suffers. One potential solution to the problem of power supply noise is to use a decoupling capacitor at the cathode of the photodiode to shunt the noise to ground. Decoupling capacitors are discrete circuit components and therefore introduce additional cost into the production of each optical receiver. Decoupling capacitors are also connected to an external ground that is often different from the ground associated with integrated circuits. This is particularly true for higher frequencies.

Other sources of high frequency noise, such as integrated circuit internal ground noise, and common mode noise are unaffected by the external decoupling capacitor. In transimpedance amplifiers, the local ground of the transimpedance amplifier is often connected to an external ground with, for example, bond wires. At higher frequencies, the inductance of the ground bond wires introduces a significant impedance between the IC internal and external ground and can therefore introduce noise that is amplified by the transimpedance amplifier, thereby reducing the performance of the transimpedance amplifier.

Common mode noise can often enter into the transimpedance amplifier through the output of the transimpedance amplifier. Other integrated circuits that connect to the output of the transimpedance amplifier can introduce common mode noise in this manner. One of the reasons that common mode noise becomes a problem is because the input stage of the transimpedance amplifier is not a differential input. As a result, common mode noise that migrates to the input stage of the transimpedance amplifier can impact the performance of the transimpedance amplifier.

BRIEF SUMMARY OF AN EMBODIMENT OF THE INVENTION

These and other limitations are overcome by embodiments of the present invention, which relates to systems and methods for filtering noise in a transimpedance amplifier and more particularly to a transimpedance amplifier with integrated filtering. Embodiments of the present invention include a transimpedance amplifier with on chip automatic gain control and DC cancellation. Embodiments of the invention provide stable operation over a wide frequency and input range with no external components such as decoupling capacitors.

In one embodiment of the invention, a separate filtering module, which may include an integrated capacitor between the cathode of the photodiode and the internal ground of the transimpedance amplifier integrated circuit in one example, is integrated into the transimpedance amplifier. The filtering module produces a filtered power supply that is provided to the cathode of the photodiode. The anode of the photodiode is then input to the transimpedance amplifier. The signal is amplified by a transimpedance amplifier and output as a differential signal.

In one embodiment, the filtering module is connected to the internal ground of the input stage of the transimpedance amplifier. This bootstraps the anode and cathode of the photodiode. By connecting the filtering module in this manner, high frequency ground noise tends to appear at both sides of the photodiode (anode and cathode) with the same amplitude and phase. Therefore, $I_{pd}=C_{pd}\partial V_{pd}/\partial t=0$.

The filtering module also filters common mode noise that enters the transimpedance amplifier through its connections to other integrated circuits such as clock and data recovery modules or post amplifiers. These and other advantages and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EMBODIMENTS OF THE INVENTION

The present invention relates to a transimpedance amplifier (TIA) that reduces the impact of high frequency noise on the performance of the TIA. Embodiments of the present invention enable a TIA to improve the performance of a TIA by filtering, by way of example and not limitation, power supply noise, ground noise, and/or common mode noise from other components. Embodiments of the invention may also reduce the parasitic capacitance associated with the photodiode used in conjunction with a TIA. Advantageously, embodiments of the invention do not require external capacitors such as external high frequency supply decoupling capacitors. This reduces the cost of a TIA.

Figure 1:
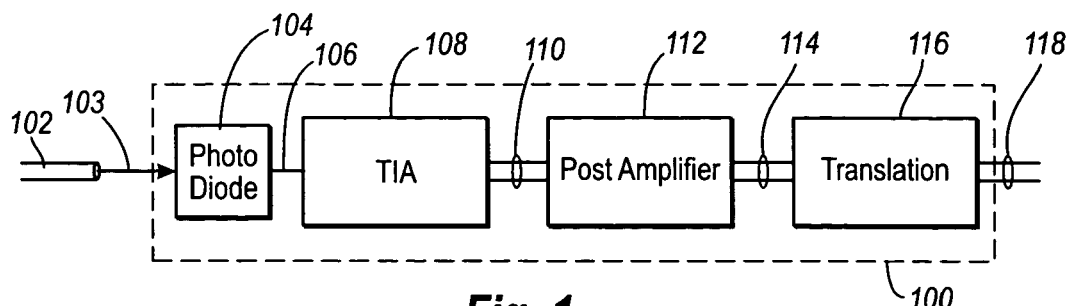
FIG. 1 illustrates one embodiment of an optical receiver that includes an integrated transimpedance amplifier.

FIG. 1 illustrates an exemplary environment for implementing embodiments of the present invention. FIG. 1 illustrates a fiber optic receiver 100 that receives an optical signal (light) and converts the optical signal to an electrical signal or data stream (usually represented as a voltage). The fiber optic receiver 100 receives an optical signal 103 over an optical fiber 102. A photodiode 104 or other optical device that converts an optical signal to an electrical signal or current receives the optical signal and generates an electrical signal 106 (current).

The TIA 108 amplifies the electrical signal 106 to produce the amplified electrical signal 110. The TIA 108 has a wide dynamic range that is able to amplify signals with large power without significantly diminishing the ability to amplify signals with low power. The amplified electrical signal 110 is then amplified by a post amplifier 112 or is operated on by another integrated circuit such as a clock and data recovery circuit. The output 114 of the post amplifier 114 is interpreted or translated by the translation module 116 and converted into an electrical digital signal 118.

Figure 2:
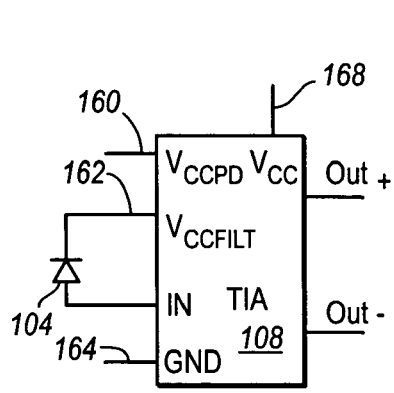
FIG. 2 shows a block diagram of an integrated transimpedance amplifier that provides a filtered power supply to connected to a photodiode.

FIG. 2 illustrates one embodiment of a TIA. In this example, the TIA 108 is an integrated circuit and has a $V_{CCPD}$ 160 input and a $V_{CC}$ 168 input. The $V_{CCPD}$ 160 supplied to the TIA 108 and the $V_{CC}$ 168 often have noise as previously described. Further the $V_{CCPD}$ 160 is not connected with the $V_{CC}$ 168 inside the TIA 108. As previously described, this noise is usually removed prior to the $V_{CCPD}$ 160 being supplied to the TIA 108. However, removing the noise from the $V_{CCPD}$ 160 outside of the TIA 108 requires additional components and introduces extra cost.

In FIG. 2, the TIA 108 filters the $V_{CCPD}$ 160 internally and produces a $V_{CCPDFiltered}$ 162 that is supplied to the photodiode 104. Light that is incident on the photodiode 104 is converted to a current and input back into the TIA 108. The TIA 108 operates on the current generated by the photodiode 104 in response to an optical signal to generate, in this example, a differential output 166. The TIA 108 also includes a ground 164. However, the ground 164 is a local ground with respect to the TIA 108 and is not necessarily the same as an external ground to which the ground 164 is connected through bond wires, for example. Embodiments of the TIA 108 also filter noise from the external ground as well as noise from the power supply.

Figure 3:
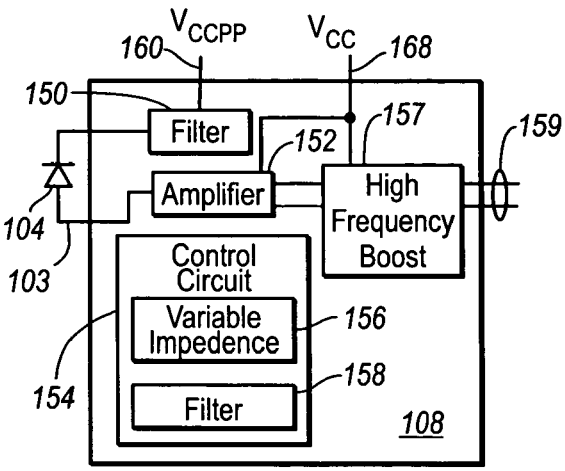
FIG. 3 illustrates one embodiment of a transimpedance amplifier with a filtering module that provides a filtered voltage to a connected photodiode.

FIG. 3 illustrates a block diagram of an exemplary TIA in accordance with the present invention. The TIA 108 receives power from the a $V_{CC}$ 168 and includes an amplifier 152 that receives an electrical current 103 from a photodiode 104 or other device that converts an optical signal into a current or voltage. The amplifier 152, which may include one or more stages, amplifies the electrical signal and helps reduce or prevent noise from affecting the quality of the received signal. A buffer may also optionally be provided at the output of the TIA 108. It is understood by one of skill in the art that the amplifier 152 can be implemented in different configurations. Exemplary configurations include, but are not limited to, a common base configuration and a shunt feedback configuration. In addition, the amplifier 152 may also include single ended amplification, differential amplification, and the like or any combination thereof.

The TIA 108 includes a filter 150 that is connected with a $V_{CCPD}$ 160. The filter 150 substantially eliminates or reduces noise on the $V_{CCPD}$ 160. The filter 150 is configured to have a relatively low impedance for high frequencies such that high frequencies are attenuated by the filter 150. The output of the filter 150 is connected to the photodiode 104 and provides a $V_{CCPDFiltered}$ to the photodiode 104. One advantage of the filter 150 is that current generated by the photodiode 104 is in response to the incident optical signal and is not generated by noise on the $V_{CCPD}$ 160 supplied to the integrated circuit. Thus, the bias filtered voltage ($V_{CCPDFiltered}$) applied to the photodiode 104 has less noise and is more constant than an unfiltered voltage. Another advantage of the filter 150 is that it is typically connected to the local ground of the TIA 108. This enables the filter 150 to effectively bootstrap the photodiode 104, thereby eliminating some of the potentially harmful effects associated with ground noise and output common mode noise.

A control circuit 154 provides both automatic gain control and direct current (DC) cancellation for the TIA 108. In the control circuit 154, a high frequency filter 158 may used to detect the DC component output by the amplifier 152. The DC component or low frequency component of the output of the amplifier 152 is passed by the high frequency filter 158 and is canceled by the variable impedance circuitry 156. In another embodiment, the high frequency filter 158 may be replaced with a peak detector or similar circuitry.

The variable impedance circuitry 156 also provides automatic gain control for the TIA 108 because it is able to attenuate at least some of the AC content of the photodiode current when the impedance of the variable impedance circuitry 156 decreases. This can extend the input range of the TIA 108. In other words, the impedance of the variable impedance circuitry 156 changes according to the average current of the photodiode 104. As the average current received from the photodiode 104 or other source increases, the impedance of the variable impedance circuitry decreases.

Because the impedance of the variable impedance circuitry 156 decreases, the variable impedance circuitry 156 absorbs or attenuates some of the AC component. This provides automatic control of the transimpedance gain of the fiber optic receiver. When the average photodiode current is low, the impedance of the variable impedance circuitry 156 is relatively large and the AC component is not absorbed or attenuated, but is amplified at the amplifier 124. Thus, the optical overload of the TIA is increased without simultaneously trading off the optical sensitivity of the TIA.

This is advantageous for the TIA 108 because the range of signals that can be amplified without clipping, saturation, or other problems, is increased. Low power signals are also amplified by the TIA 108 as the AC component is not absorbed or attenuated by the variable impedance circuitry 156, while optical signals with higher optical power are partially absorbed or attenuated by the variable impedance circuitry 156. The TIA 208 can thereby successfully amplify a wide range of signals. This example of a TIA 108 shown in FIG. 3 also includes a high frequency boost 157. The high frequency boost 157 to $V_{CC}$ extends the bandwidth of the TIA 108.

Figure 4:
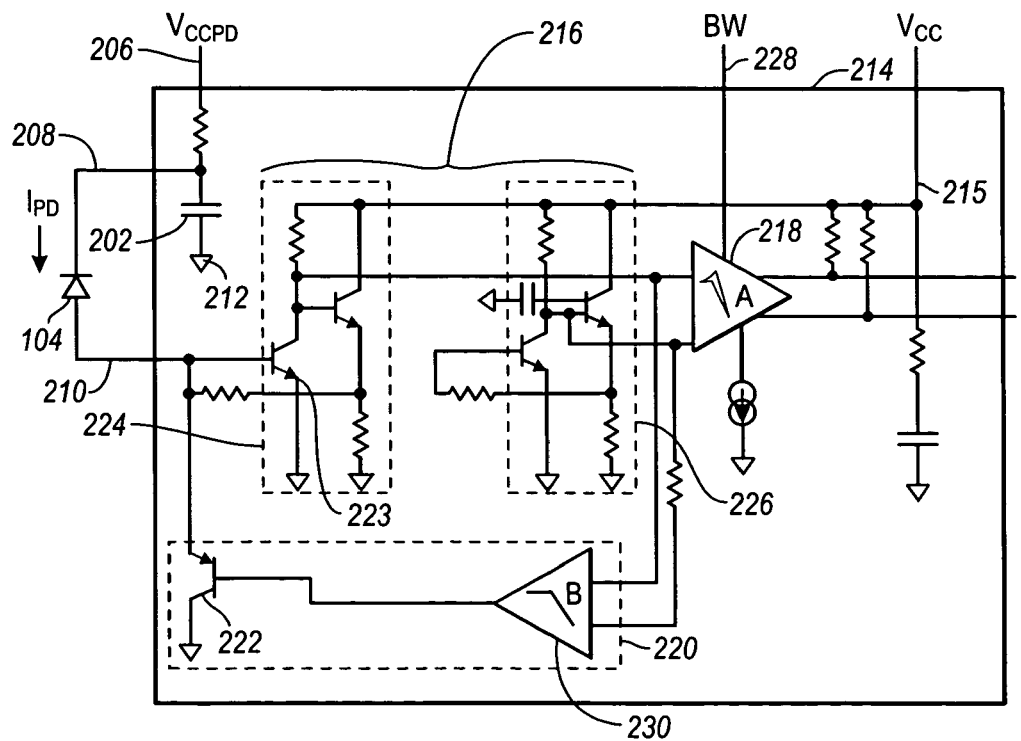
FIG. 4 illustrates one embodiment of a schematic of a transimpedance amplifier using an integrated capacitor to filter at least power supply noise.

FIG. 4 illustrates another embodiment of the TIA 108. In FIG. 4, the cathode of the photodiode 104 is coupled to a capacitor 202 that is integrated with the TIA 214. The capacitor 202 is coupled in this example to the local ground 212. Connecting the capacitor 202 with the local ground 212 is distinct from coupling with an external ground because of the inductance that may exist in, for example, bond wires that connect the local ground 212 with the external ground. The capacitor 202 may also be coupled, for example to an emitter 223 of the input stage 224.

The capacitor 202 is one example of a filter of high frequency noise from the power supply. $V_{CC}$ 215 is received into the TIA 214 and is separate from the $V_{CCPD}$ 206. The TIA 214 filters the high frequency noise from the $V_{CCPD}$ 206 with the capacitor 202 to an internal ground 212 and provides a filtered $V_{CCFiltered}$ 208 to the photodiode 104. The current 210 generated by the photodiode 104 is thus generated in response to an optical signal and is not attributable to changes in the cathode voltage of the photodiode 104 caused by power supply noise.

The current 210 generated by the photodiode is received at the amplifier 216 (arranged in a shunt feedback configuration in FIG. 4), which includes a first stage 224 and a second stage 226 in this example. The first stage 224 and the second stage 226 produce inputs to the gain stage 218, which include a high frequency boost 228 in this example. The output of the gain stage 218 is a differential voltage signal in this embodiment.

The amplifier 216 of the TIA 214 is configured, in this example, in a shunt feedback configuration as previously stated. In another embodiment, the amplifier 216 may be configured in a common base topology configuration. The output of the second stage 226 is provided to the control circuit 220 that, as described above, provides a variable impedance and a filter 158. The DC or low frequency component of the output of the amplifier 216 is passed by the low frequency operation amplifier 230. The amplifier 230 drives the base of the pnp transistor 222. The emitter of the pnp transistor 222 is coupled with the signal generated by the photodiode 104. As the average photodiode current increases, the emitter impedance of the transistor 222 decreases. This enables some of the AC component being processed by the first stage 224 to be absorbed by the transistor 222 and permits the TIA to amplify or transmit signals whose optical power is large. The pnp transistor 222 is an example of the variable impedance circuitry of FIG. 3.

Because the TIA shown FIG. 4 uses a pnp transistor instead of a npn transistor for the transistor 222, the AC content or component of the photodiode current will be absorbed or attenuated by the transistor 222 when the impedance seen at the emitter of the transistor 222 decreases. This is the case when the photodiode current increases and the optical signal detected by the photodiode has increased power.

Other arrangements of the amplifier 216, the variable impedance 156, and the filter 158 are described in U.S. application Ser. No. 10/839,640, which is hereby incorporated by reference in its entirety.

Figure 5:
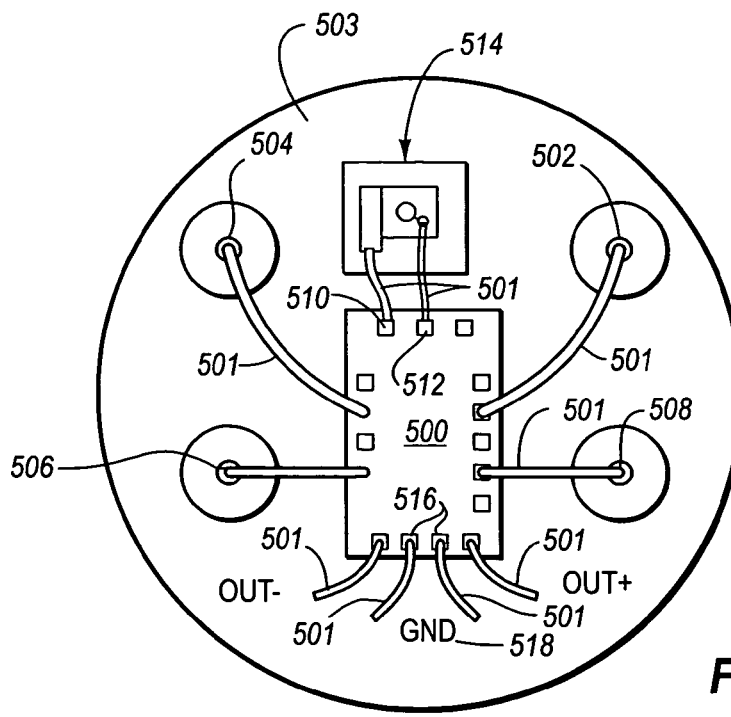
FIG. 5 illustrates an integrated transimpedance amplifier mounted in a transistor outline header.

FIG. 5 illustrates an exemplary illustration of a transistor outline (TO) header that includes a TIA. The photodiode 514 may be positioned within the TO can such that, in one embodiment, the photodiode 514 maximizes the light collected through a lens of the TO can. In FIG. 5, the pins of the integrated TIA 500 are connected to the TO header 503 using bond wires 501. The TIA receives $V_{CC}$ 502 and $V_{CCPD}$ 504, which is the power to the photodiode 514. The $V_{CC}$ 502 and the $V_{CCPD}$ 504 may come from the same or different power supplies. Internal to the TIA 500, the $V_{CC}$ 502 and the $V_{CCPD}$ 504 are separated.

As previously described, the $V_{CCPD}$ 504 is input to the TIA 500 (an integrated circuit in this example), which includes a filter to reject the high frequency power supply noise as described. The TIA 500 then generates a filtered $V_{CCFiltered}$ 510 that is connected with the cathode of the photodiode 514. Thus, the filtered $V_{CCFiltered}$ 510 connects with the cathode of the photodiode 514. The anode of the photodiode 514 connects to the input 512 of the TIA 500 and is supplied to the first stage of the amplifier as previously described. The pins 506 and 508 are the outputs (OUT− and OUT+) of the TIA 500.

The TIA 500 can experience ground noise in addition to the power supply noise. An external ground 518 is connected to the TIA 500 through the pins 516 using bond wires 501. At higher frequencies, the local ground of the TIA 500 is not the same as the external ground 518. The bond wires connecting the internal ground 516 with the external ground 518, for example, have inductance at higher frequencies that can lead to ground noise. Connecting to the external ground 518 using multiple bond wires reduces the inductance that contributes to ground noise.

The capacitor 202 can also contribute to a reduction in ground noise because the capacitor 202 is connected with the internal ground of the TIA. For example, the capacitor 202 may be connected at an emitter (which is connected to the local ground of the TIA) of the amplifier's input stage. In some embodiments, the noise (power supply noise, ground noise, output common mode noise, for example) that appears at the power supply side of the capacitor 202 tends to be similar to the noise that appears and the local ground side of the capacitor 202. Because the potential on either side of the capacitor 202 tends to be the same with respect to the noise, there is no current through the capacitor due to noise. As a result, the effect of the noise on the current of the photodiode being amplified is reduced.

Figure 6:
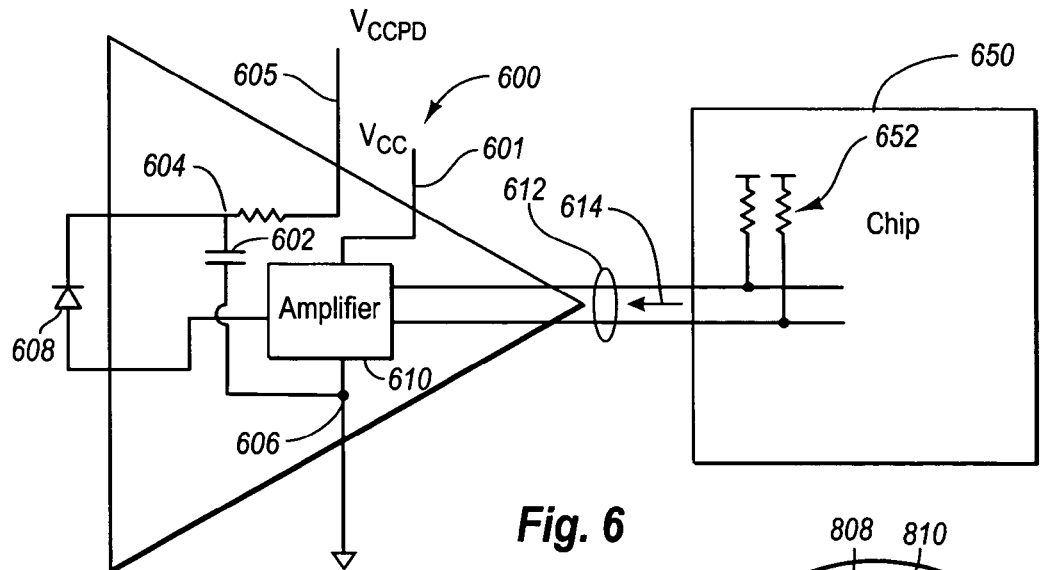
FIG. 6 illustrates another embodiment of a transimpedance amplifier with an integrated bootstrapped capacitor connected to a power supply and an internal ground of the transimpedance amplifier.

FIG. 6 illustrates another embodiment of a TIA 600. This example illustrates a bootstrapped capacitor 604 that is connected across node 604 and the node 606. In this example, the node 604 is effectively connected with the $V_{CCPD}$ 605 and the node 606 is coupled to the local ground of the TIA 605 as well as with the amplifier 610. As previously stated, noise at the local ground can be amplified by the amplifier 610. Connecting the capacitor 602 as described reduces the noise ground noise that is amplified. In this example, the $V_{CC}$ 601 is separate from the $V_{CCPD}$ 605 inside the TIA 600.

FIG. 6 also illustrates a second integrated circuit 650 that may be, for example, a post amplifier or a clock and data recover module. The integrated circuit 650 has an open collector input 652 that connects with the differential output 612 of the TIA 600. The integrated circuit 650 can generate common mode noise that is input to the TIA 600 through the outputs 612 of the TIA 600.

Because the input to the TIA 600 from the photodiode 608 is single ended rather than a differential input, the common mode noise may migrate to the input of the amplifier 610 and reduce the performance of the TIA 600. The capacitor 604, however, reduces the effect of common mode noise 614 because the common mode noise appears at the node 604 and the node 606. As a result, both the node 604 and the node 606 effectively move together and effectively no current is generated that can be input to the amplifier 610. The common mode noise is effectively removed from the input to the amplifier 610.

Figure 7:
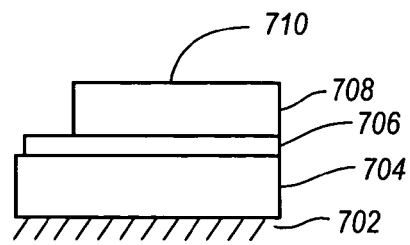
FIG. 7 illustrates a side view of a photodiode that receives a filtered voltage from the transimpedance amplifier and illustrates one example reducing parasitic capacitance that can impact the performance of the transimpedance amplifier.

FIG. 7 illustrates one embodiment of a photodiode for use in embodiments of the invention. The photodiode 708 has an anode 710 and a cathode 706. The cathode 706 is typically connected, using a bond wire in one embodiment, to the $V_{CCFiltered}$ output of the TIA integrated circuit. The anode 710 is typically connected to the input of the TIA integrated circuit.

The photodiode 708 is formed on a substrate 704 that is electrically non-conducting. The substrate 702 may be formed on a ground plane 702. To ensure the performance of the receiver, it is useful to minimize the parasitic capacitance that may be formed between the cathode 706 and the ground plane 702. This can be achieved in various methods. For example, the thickness and dielectric constant of the substrate 704 can be selected to minimize the capacitance. In addition, the area of the cathode with respect to the ground plane 702 can also be minimized. In other words, the parasitic capacitance should be minimized to improve the high frequency power supply noise rejection and ground noise rejection. Minimizing the parasitic capacitance improves the power supply rejection, the ground noise rejection, and the photodiode power supply rejection at higher frequencies.

Figure 8:
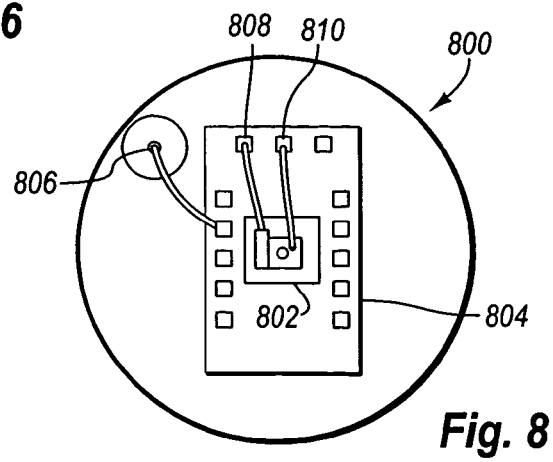
FIG. 8 illustrates an embodiment where a photodiode is mounted on top of a transimpedance amplifier to reduce parasitic capacitance.

FIG. 8 illustrates an embodiment of the invention where the photodiode is mounted on top of a TIA. In this example, the photodiode 802 is mounted on top of the TIA 804. The $V_{CCPD}$ 806 is filtered inside the TIA 804 and $V_{CCPDFiltered}$ 808 is connected with a cathode of the photodiode 802 and the anode of the photodiode is input at 810 to the TIA 804. Advantageously, parasitic capacitance associated with the photodiode 804 is thereby reduced. For example, the system 800 may be a transistor outline (TO) can and placing the photodiode on top of the TIA can reduce a parasitic capacitance between the photodiode and a ground of the TO can. In one embodiment, the photodiode 802 is typically mounted within a TO can or system 800 in the center in order to collect the light from a lens on top of the TO can.

Figure 9:
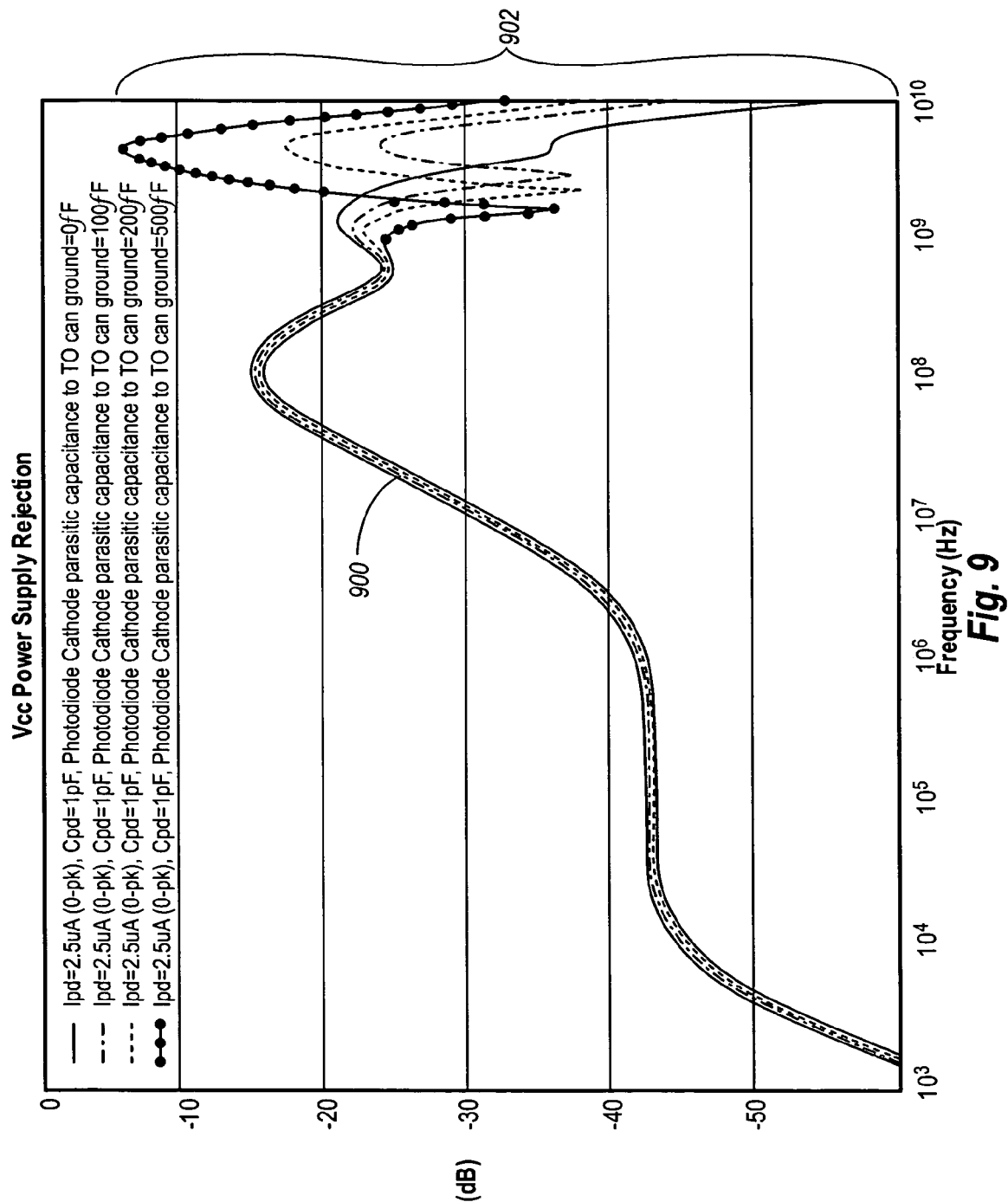
FIG. 9 illustrates the impact of parasitic capacitance with respect to $V_{CC}$ power supply rejection.
Figure 10:
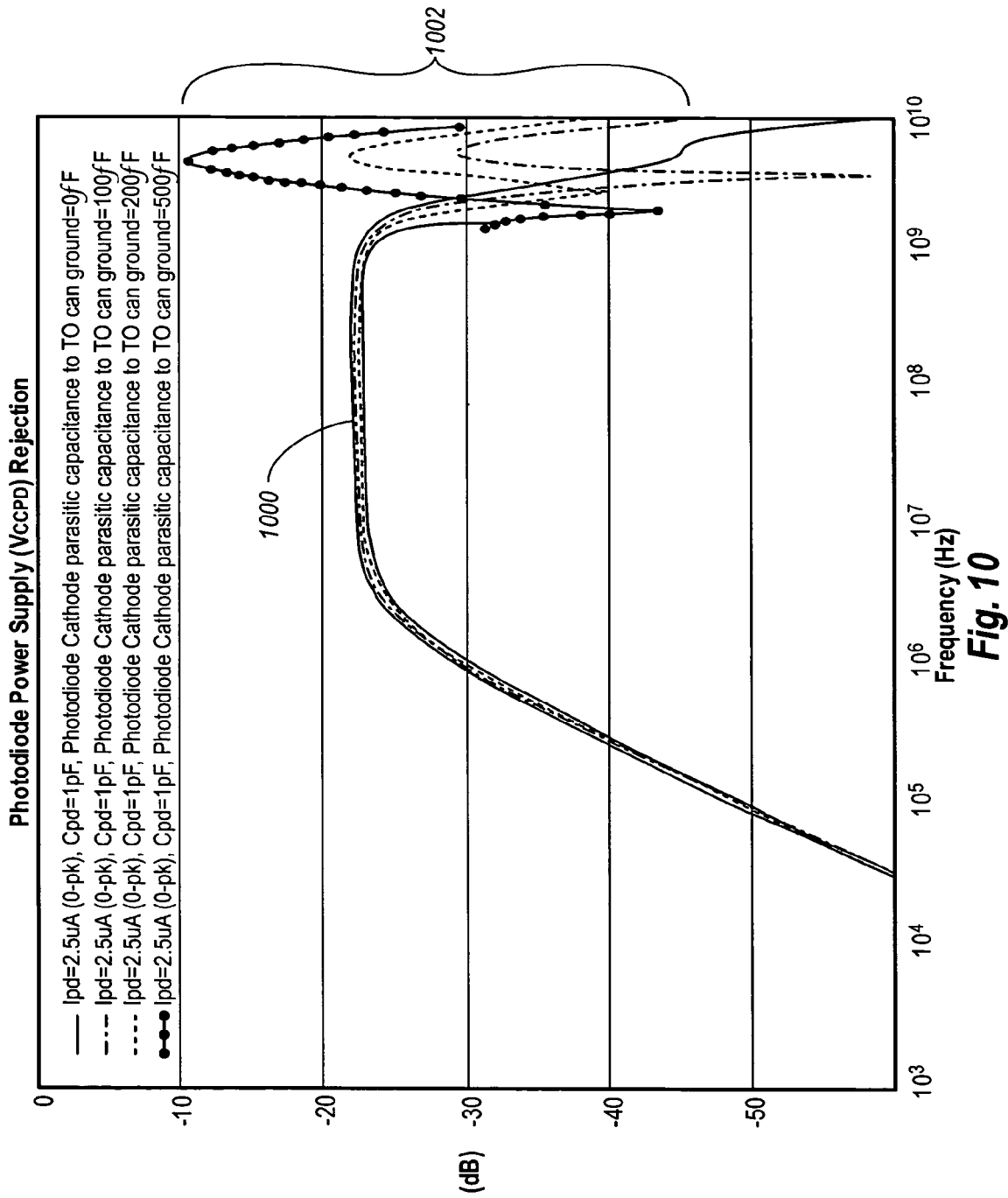
FIG. 10 illustrates the impact of parasitic capacitance with respect to photodiode power supply rejection.

FIG. 9 illustrates the power supply noise ($V_{CC}$) rejection 900 using various levels of parasitic capacitance. As illustrated by the plots 902 at higher frequencies, the ability of the TIA to reject power supply noise decreases as the parasitic capacitance between the cathode of the photodiode and the external ground increases. FIG. 10 illustrates the photodiode power supply ($V_{CCPD}$) rejection 1000 using various levels of parasitic capacitance. The plots 1002 illustrate that the ability to reject photodiode power supply noise decreases as the parasitic capacitance increases.

Figure 11:
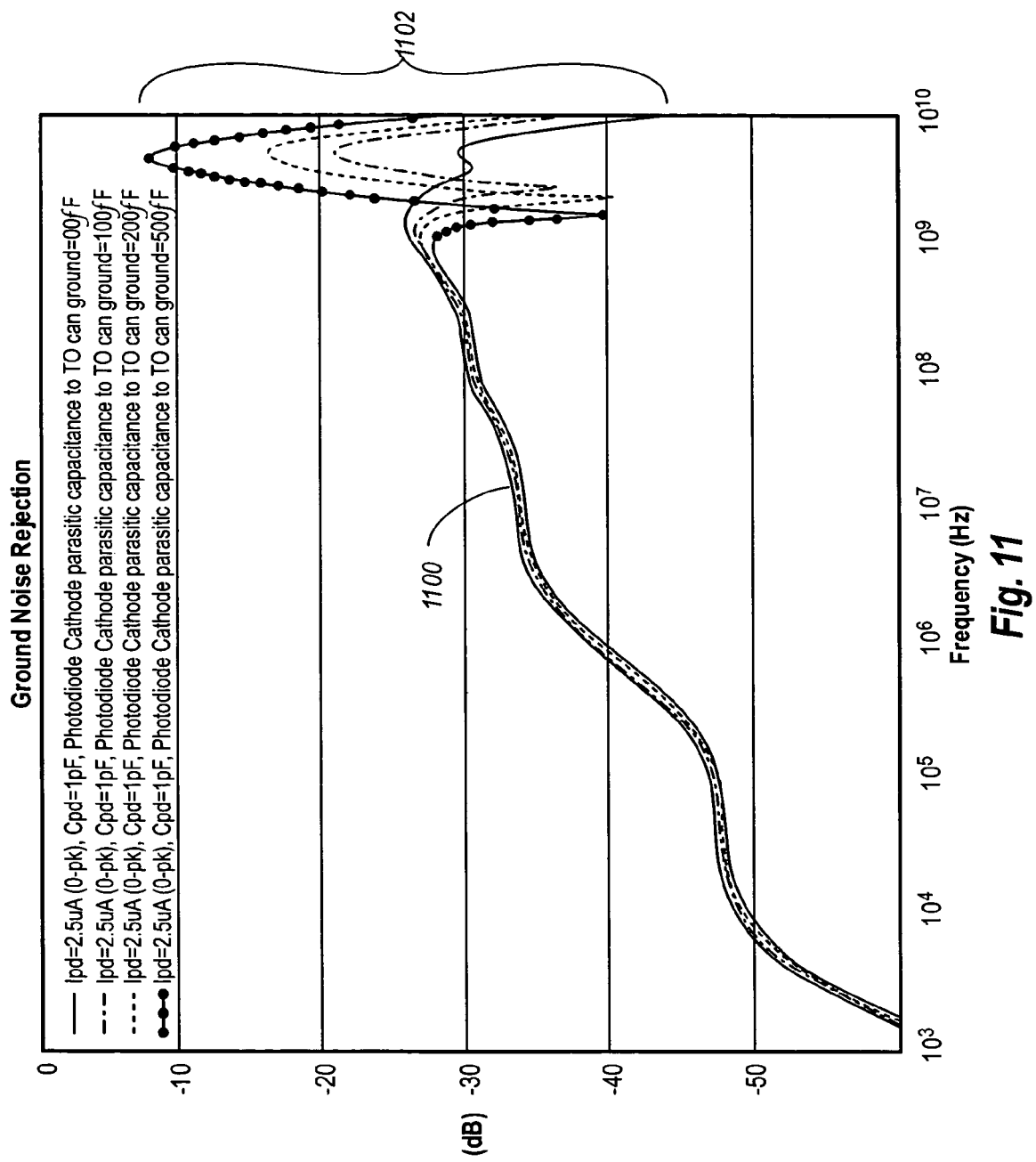
FIG. 11 illustrates the impact of parasitic capacitance with respect to ground noise rejection.
Figure 12:
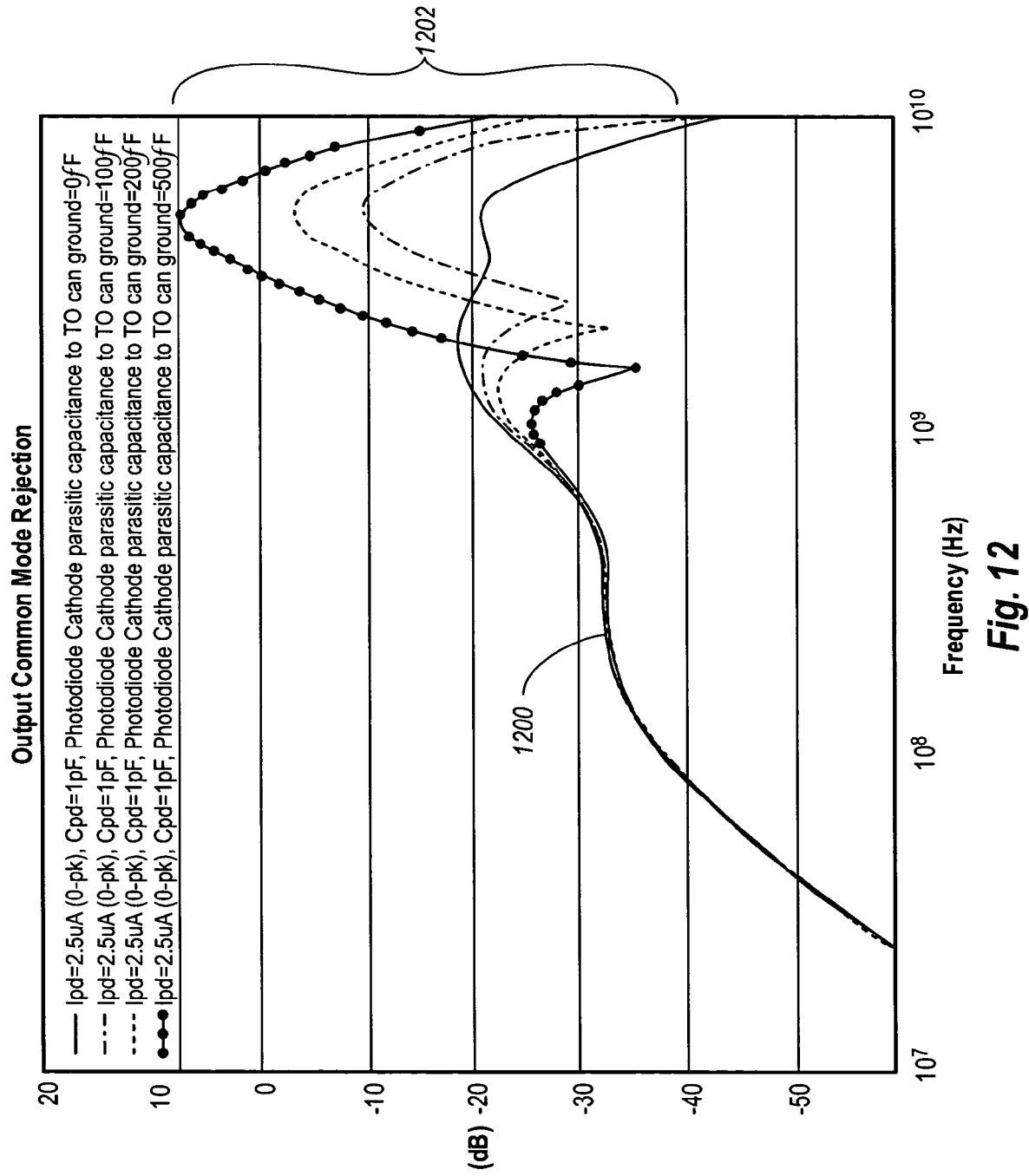
FIG. 12 illustrates the impact of parasitic capacitance with respect to output common mode rejection.

FIG. 11 illustrates the ground noise rejection 1100 associated with various levels of parasitic capacitance. The plots 1102 illustrate that the ability to reject ground noise decreases as the parasitic capacitance increases. FIG. 12 illustrates the output common mode noise rejection 1200 for various levels of parasitic capacitance and the plots 1202 illustrate that the, ability to reject output common mode noise decreases as the parasitic capacitance increases.

The photodiode, as illustrated for example in FIGS. 7 and 8, reduce the parasitic capacitance. As a result, the TIA is able to reject power supply noise, photodiode power supply noise, ground supply noise, and output common mode noise better at higher frequencies, as shown in FIGS. 9-12.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An integrated circuit for amplifying an input from photodiode, the integrated circuit comprising:
    an input that receives a current from a photodiode in response to incident light on the photodiode;
    an amplifier having one or more stages that amplifies the current from the photodiode and generates a voltage output;
    a filtered voltage output that provides a filtered bias voltage to the photodiode; and
    an integrated filter module connected between the filtered voltage output and an external photo diode power supply, wherein the filter module filters noise on the photodiode power supply to generate the filtered bias voltage that is provided to the photodiode from the integrated circuit, wherein the filter module connects to a local ground that is internal to the integrated circuit.

2. An integrated circuit as defined in claim 1, wherein the filter module is a capacitor that is connected to the filtered voltage output and the local ground of the integrated circuit such that the photo diode power supply connects with the photodiode through the integrated circuit and wherein the photodiode power supply is separated from a second power supply inside the integrated circuit.

3. An integrated circuit as defined in claim 1, wherein the voltage output of the amplifier is a differential voltage output and wherein the amplifier includes at least one input stage and at least one gain stage.

4. An integrated circuit as defined in claim 3, further comprising a control circuit that includes provides automatic gain control, the control circuit comprising a pnp transistor having an emitter connected with the amplifier such that an impedance of the pnp transistor decreases as an average power of the current from the photo diode increases.

5. An integrated circuit as defined in claim 3, wherein the filter module is connected to an emitter of a first stage of the amplifier.

6. An integrated circuit as defined in claim 3, wherein the filter module filters ground noise.

7. An integrated circuit as defined in claim 3, wherein the filter module filters common mode noise generated by another integrated circuit connected with a differential output.

8. An integrated circuit as defined in claim 1, further comprising a high frequency bandwidth booster that extends a frequency range of current amplified in the integrated circuit.

9. An optical receiver that detects an incident light signal and generates an amplified output, the optical receiver comprising:
   a photo diode disposed on a substrate and configured to minimize a parasitic capacitance associated with the photodiode; and
   a transimpedance amplifier connected with the photodiode, the transimpedance amplifier generating a filtered voltage to bias the photodiode, the transimpedance amplifier comprising:
      an amplifier that receives an input current generated by the photo diode in response to incident light;
      a control circuit that provides DC cancellation of the input current and that includes a variable impedance to partially attenuate the input current as a power of the incident light increases; and
      an integrated capacitor connected with an external power supply and to a local ground that is internal to the transimpedance amplifier, wherein the integrated capacitor filters noise from the external power supply to produce a filtered voltage and filters ground noise from an external ground connected with the local ground of the transimpedance amplifier.

10. An optical receiver as defined in claim 9, wherein the substrate has a thickness and a dielectric constant selected to minimize the parasitic capacitance and wherein an area of a cathode of the photodiode with respect to a ground plane is minimized.

11. An optical receiver as defined in claim 9, wherein a cathode of the photodiode is connected with the filtered voltage generated by the transimpedance amplifier and an anode of the photodiode is connected with the amplifier.

12. An optical receiver as defined in claim 9, wherein the substrate is non-conducting.

13. An optical receiver as defined in claim 9, wherein the transimpedance amplifier further comprises a bandwidth booster to extend an input range of the transimpedance amplifier.

14. An optical receiver as defined in claim 9, wherein the control circuit further comprises a variable impedance and a filter, wherein the variable impedance comprises a pnp transistor having an emitter connected with the amplifier and wherein the filter detects a DC component of the input current.

15. An optical receiver as defined in claim 14, wherein an impedance of the variable impedance decreases as an average power of the input current increases and the impedance increases when the average power of the input current decreases such that the input current is partially attenuated as the input current increases, thereby providing automatic gain control.

16. An optical receiver as defined in claim 9, wherein the capacitor is connected with the power supply, a cathode of the photodiode, and a local ground of the transimpedance amplifier such that noise of the power supply is decoupled from the photodiode.

17. An optical receiver as defined in claim 9, wherein the capacitor bootstraps the amplifier to provide at least one of ground noise rejection, power supply rejection, and output common mode noise rejection.

18. An optical receiver as defined in claim 9, wherein common node noise entering the transimpedance amplifier through a differential output of the transimpedance amplifier is filtered from the amplifier by the capacitor.

19. An optical receiver as defined in claim 9, wherein the amplifier is a shunt feedback amplifier.

20. An optical receiver as defined in claim 9, wherein the amplifier is a common base amplifier.

21. An optical receiver for detecting incident light and generating a differential electrical output that corresponds to the incident light, the optical receiver comprising:
   a photodiode mounted to a substrate such that a parasitic capacitance between the photodiode and a ground plane is minimized, wherein the photodiode generates an input current in response to incident light; and
   an integrated circuit having a local ground that is connected to an external ground using one or more connections, the integrated circuit comprising:
      an amplifier that receives the input current and generates an amplified differential voltage an a differential output;
      a photo diode power supply input and a filtered voltage output, wherein the filtered voltage output connects with a cathode of the photodiode and the photodiode power supply input connects with a photo diode power supply, wherein the photodiode power supply is separate from a second power supply provided to the integrated circuit; and
      an integrated capacitor, bootstrapped between the photo diode power supply input and the local ground, that reduces noise from the input current by filtering:
         power supply noise entering the integrated circuit from the photo diode power supply or the second power supply;
         ground noise entering the integrated circuit from the external ground to the local ground;
         common mode noise entering the integrated circuit through a differential output of the integrated circuit; and
      a control circuit that provides automatic gain control and DC cancellation, wherein the control circuit comprises:
         a filter that passes a DC component of the output of the amplifier; and
         a pnp transistor that is driven by the DC component, the pnp transistor having an emitter connected with an input stage of the amplifier,
         wherein an impedance of the pnp transistor decreases an the DC component increases and wherein the impedance of the pnp transistor increases and the DC component decreases.

22. An optical receiver as defined in claim 21, wherein the photo diode is a pin photodiode.

23. An optical receiver as defined in claim 21, wherein the photodiode is mounted on top of the integrated circuit.

24. An optical receiver as defined in claim 21, wherein the substrate is non conductive, wherein the capacitance between the photodiode and the ground plane is minimized by configuring one or more of a dielectric constant of the substrate, an area of the photodiode; and a thickness of the substrate.

25. An optical receiver as defined in claim 21, wherein the integrated circuit further comprises a bandwidth booster to extend a frequency range.

26. An optical receiver as defined in claim 21, wherein the integrated circuit is a transimpedance amplifier.

27. An optical receiver as defined in claim 21, wherein one or more connections to and from the integrated circuit are bond wires.

28. An optical receiver as defined in claim 27, wherein a length of the bond wires is minimized.

* * * * *

UNITED STATES PATENT AND TRADEMARK OFFICE
CERTIFICATE OF CORRECTION

PATENT NO. : 7,418,213 B2
APPLICATION NO. : 10/917136
DATED : August 26, 2008
INVENTOR(S) : Denoyer It is certified that error appears in the above-identified patent and that said Letters Patent is hereby corrected as shown below:

Title Page
Assistant Examiner, change "Danny W" to --Danny W.--

Drawings
Replace Figure 3 with the figure depicted herein below, wherein "$V_{CCPP}$" has been changed to "$V_{CCPD}$"; "103" has been changed to --106--; and "159" has been removed.

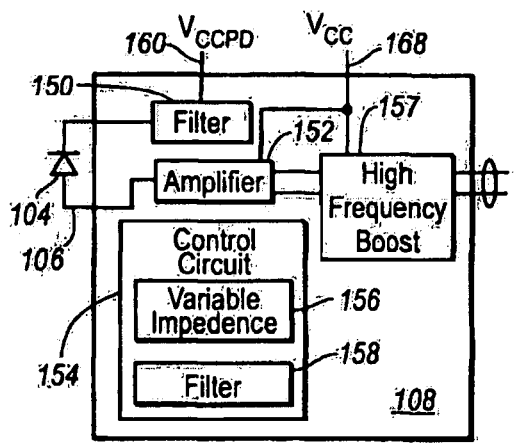

Column 3
Lines 11-12, remove "to connected"
Line 39, insert --noise-- after "mode"

Column 4
Line 6, change "114" to --112--
Line 25, remove "166"
Line 35, change "103" to --106--

Signed and Sealed this

Twenty-third Day of November, 2010

David J. Kappos
Director of the United States Patent and Trademark Office

Column 5
Line 25, change "124" to --152--
Line 35, change "208" to --108--
Line 55, change "an internal" to --local--

Column 6
Line 27, insert --circuitry-- after "impedance"
Line 56, remove "516"

Column 7
Line 2, change "and" to --at--
Line 9, change "604" to --602--
Line 12, change "605" to --600--
Line 28, change "604" to --602--
Line 43, change "702" to --704--

Column 8
Line 19, change "the," to --the--
Claim 1, line 37, change "from" to --from a--
Claim 1, line 47, change "photo diode" to --photodiode--
Claim 2, line 56, change "photo diode" to --photodiode--
Claim 4, line 65, remove "includes"

Column 9
Claim 4, line 2, change "photo diode" to --photodiode--
Claim 9, line 18, change "photo diode" to --photodiode--
Claim 9, line 26, change "photo diode" to --photodiode--

Column 10
Claim 18, line 9, change "node" to --mode--
Claim 21, line 28, change "an a" to --and a--
Claim 21, line 30, change "photo diode" to --photodiode--
Claim 21, line 33, change "photo diode" to --photodiode--
Claim 21, lines 37-38, change "photo diode" to --photodiode--
Claim 21, line 41, change "photo diode" to --photodiode--
Claim 21, line 58, change "an the DC" to --and the DC--
Claim 22, line 62, change "photo diode" to --photodiode--
Claim 24, line 67, change "non conductive" to --non-conductive--

Column 11
Claim 24, line 2, change "of a" to --of: a--